US010222231B2

(12) United States Patent
Allen (10) Patent No.: US 10,222,231 B2
(45) Date of Patent: Mar. 5, 2019

(54) APPARATUS AND METHOD FOR SENSING

(71) Applicant: Nokia Technologies Oy, Espoo (FI)

(72) Inventor: Mark Allen, Cambridgeshire (GB)

(73) Assignee: Nokia Technologies Oy, Espoo (FI)

( * ) Notice: Subject to any disclaimer, the term of this patent is extended or adjusted under 35 U.S.C. 154(b) by 0 days.

(21) Appl. No.: 15/523,444

(22) PCT Filed: Oct. 21, 2015

(86) PCT No.: PCT/FI2015/050715
§ 371 (c)(1),
(2) Date: May 1, 2017

(87) PCT Pub. No.: WO2016/071560
PCT Pub. Date: May 12, 2016

(65) Prior Publication Data
US 2017/0307405 A1    Oct. 26, 2017

(30) Foreign Application Priority Data
Nov. 5, 2014    (EP) ..................... 14191823

(51) Int. Cl.
| G01R 17/10 | (2006.01) |
| G01D 3/08  | (2006.01) |
| G01R 17/02 | (2006.01) |
| G01D 5/14  | (2006.01) |

(52) U.S. Cl.
CPC ................. G01D 3/08 (2013.01); G01D 5/14 (2013.01); G01R 17/02 (2013.01)

(58) Field of Classification Search
CPC . G01D 3/08; G01D 5/14; G01R 17/02; G01R 17/10; G01R 17/16; G01R 19/02; G01R 19/03; G01L 1/20; G01L 1/22; G01L 9/02
See application file for complete search history.

(56) References Cited

U.S. PATENT DOCUMENTS 3,539,918 A  *  11/1970  Boyd ..................... G01R 1/206
                                                         324/706
3,588,539 A  *   6/1971  Milan .................. H03K 17/615
                                                         327/392
4,052,716 A  *  10/1977  Mortensen ......... G08B 13/1895
                                                         250/DIG. 1

(Continued)

FOREIGN PATENT DOCUMENTS

| CN | 103575321 A | 2/2014 |
| CN | 203642951 U | 6/2014 |

(Continued)

*Primary Examiner* — Thang X Le
(74) *Attorney, Agent, or Firm* — Harrington & Smith (57) ABSTRACT

According to aspects of the present disclosure there is provided an apparatus and method for sensing. The apparatus includes a sensor circuit which includes a first output terminal, a second output terminal and a sensor that is provided in a bridge circuit arrangement. The sensor circuit is configured such that a sensor measurement can be determined based on a voltage difference between first and second output terminals. The apparatus is configured so as to prevent a current from being able to flow from the first output terminal through the sensor circuit to the second output terminal.

15 Claims, 8 Drawing Sheets

(56) References Cited

U.S. PATENT DOCUMENTS

| | | | | |
|---|---|---|---|---|
| 4,086,524 | A * | 4/1978 | Kremer | G01R 17/10 |
| | | | | 320/136 |
| 5,187,985 | A * | 2/1993 | Nelson | G01L 1/2281 |
| | | | | 338/3 |
| 5,189,362 | A | 2/1993 | Doble | 324/106 |
| 6,422,088 | B1 * | 7/2002 | Oba | G01D 3/08 |
| | | | | 73/754 |
| 8,245,562 | B2 * | 8/2012 | Dawson | G01L 27/007 |
| | | | | 702/116 |
| 2004/0245585 | A1 * | 12/2004 | Johnson | G01L 9/06 |
| | | | | 257/414 |
| 2014/0007705 | A1 | 1/2014 | Campbell et al. | 73/862.628 |
| 2014/0376595 | A1 * | 12/2014 | Daley | H01L 28/20 |
| | | | | 374/185 |

FOREIGN PATENT DOCUMENTS

| | | |
|---|---|---|
| DE | 837 884 | 5/1952 |
| EP | 1 087 219 A2 | 3/2001 |
| JP | S47-037561 | 1/1972 |
| JP | H07-318430 | 12/1995 |
| JP | 2014-007201 | 1/2014 |

* cited by examiner

APPARATUS AND METHOD FOR SENSING

TECHNOLOGICAL FIELD

Examples of the present disclosure relate to an apparatus and method for sensing. Certain non-limiting examples relate to a sensor circuit for use in a sensor array.

BACKGROUND

Conventional sensor systems for reading out or measuring an output signal from a sensor are not always optimal. For example, some conventional systems for sensing a particular property (e.g. temperature, humidity, pressure, stress, strain, and light) may involve a read out and measurement of an output signal from a sensor, such as voltage, which can be used to determine the property which the sensor is responsive to. Some conventional sensor systems may have a limited capability to detect small changes in a sensor's voltage output.

The listing or discussion of any prior-published document or any background in this specification should not necessarily be taken as an acknowledgement that the document or background is part of the state of the art or is common general knowledge. One or more aspects/examples of the present disclosure may or may not address one or more of the background issues.

BRIEF SUMMARY

According to at least some but not necessarily all examples of the disclosure there is provided an apparatus comprising a sensor circuit comprising: a first output terminal, a second output terminal and a sensor provided in a bridge circuit arrangement;
wherein the sensor circuit is configured such that a sensor measurement can be determined based on a voltage difference between the first and second output terminals; and
wherein the apparatus is configured so as to prevent a current from being able to flow from the first output terminal through the sensor circuit to the second output terminal.

The bridge circuit arrangement is a Wheatstone bridge arrangement.

One or more of the apparatuses may be provided as part of a module, a device or arranged in an array.

According to at least some but not necessarily all examples of the disclosure there is provided a method comprising preventing a current from flowing from an output terminal of a sensor circuit through the sensor circuit to another output terminal of the sensor circuit, wherein the sensor circuit comprises: a sensor provided in a bridge circuit arrangement; wherein the sensor circuit is configured such that a sensor measurement can be determined based on a voltage difference between the output terminals of the sensor circuit.

According to at least some but not necessarily all examples of the disclosure there is provided an apparatus comprising means configured to enable the apparatus at least to perform the above method.

BRIEF DESCRIPTION OF THE DRAWINGS

For a better understanding of various examples of the present disclosure that are useful for understanding the detailed description and certain embodiments of the invention, reference will now be made by way of example only to the accompanying drawings in which.

DETAILED DESCRIPTION

The Figures schematically illustrate an apparatus 100 comprising:
a sensor circuit 101, comprising: a first output terminal 104, a second output terminal 105 and a sensor 102 provided in a bridge circuit arrangement 103;
wherein the sensor circuit 101 is configured such that a sensor measurement can be determined based on a voltage difference between the first and second output terminals 104, 105 of the sensor circuit 101;
and wherein the apparatus 100 is configured so as to prevent a current from being able to flow from the first output terminal 104 through the sensor circuit 101 to the second output terminal 105.

Examples of the present disclosure will now be described with reference to the Figures. Similar reference numerals are used in the Figures to designate similar features. For clarity, all reference numerals are not necessarily displayed in all figures.

Figure 1:
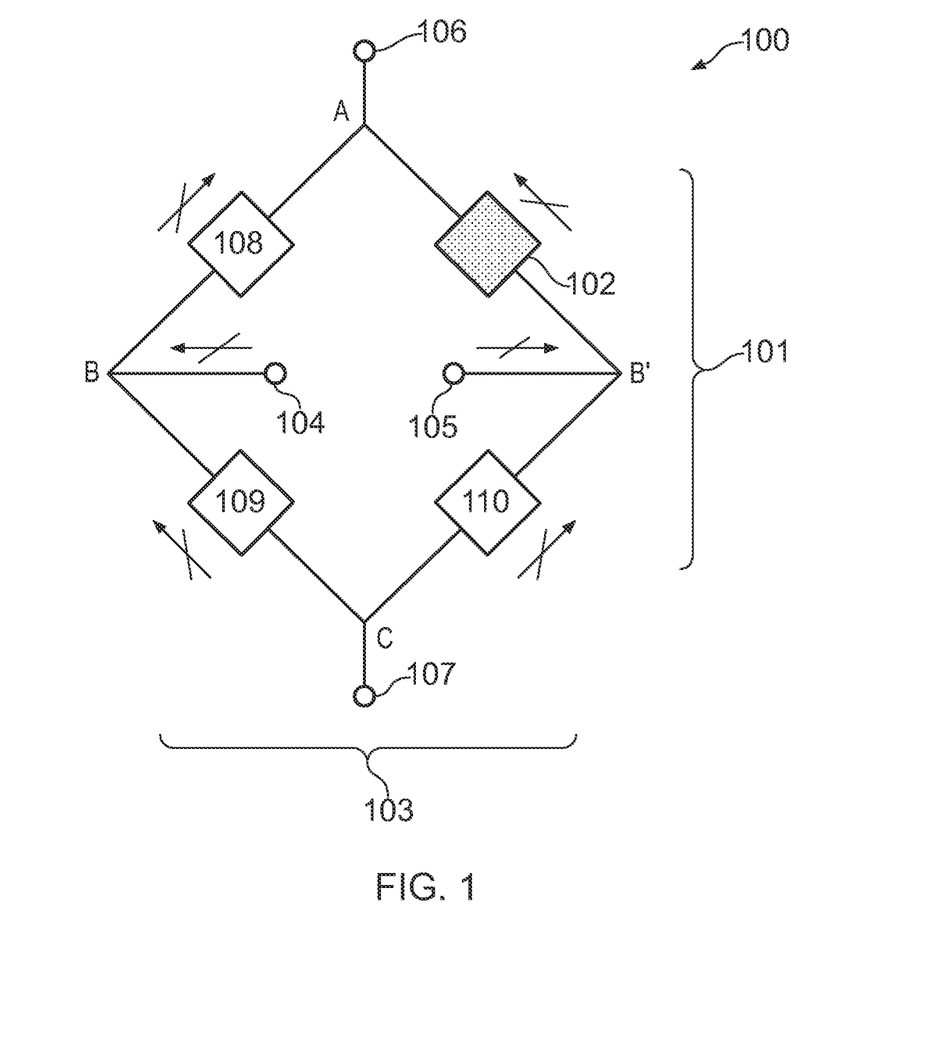
FIG. 1 schematically illustrates an example apparatus according to the present disclosure.

FIG. 1 schematically illustrates an apparatus 100 according to an example of the present disclosure. The apparatus 100 comprises a sensor circuit 101. The sensor circuit is configured in a bridge circuit arrangement 103 and comprises a sensor 102 within the bridge circuit arrangement 103.

The bridge circuit arrangement 103 comprises two branches ABC and AB'C. Each branch comprises a least two arms, i.e. a first branch ABC comprises arms AB and BC, whilst the second branch AB'C comprises arms AB' and B'C. Each circuit branch of the sensor circuit comprises an output terminal located at an intermediary point along the respective branch. A first output terminal 104 is located at an intermediary point B between arms AB and BC of the first branch ABC. Likewise, a second output terminal 105 is located at an intermediary point B' within the second branch AB'C between arms AB' and B'C.

The sensor circuit has input terminals 106 and 107 whereby an input voltage may be provided to the sensor circuit. A first input terminal 106 is located at a node point A common to both the first and second branches, i.e. where the two branches ABC and AB'C start to branch off from one another. A second terminal 107 is located at a node point C common to both the first and second branches, i.e. where the two branches ABC and AB'C come back together. A voltage $V_D$ may be provided to input terminal 106 and terminal 107 may be connected to lower potential, e.g. ground.

The sensor 102 is located within one of the arms AB' of one of the branches AB'C of the sensor circuit 101. A sensor measurement can be determined based on a voltage difference between output terminals 104 and 105 of the sensor circuit.

The sensor 102 may be a resistive type sensor whose resistance value varies in accordance with a property the sensor is configured to measure. The sensor may have a nominal impedance value (that may have both a resistive and reactive component) of which either both the real and imaginary part may change or just one component may change for detection/measurement. Each of the other arms AB, BC and B'C of the sensor circuit 101 may be provided with one or more electrical components 108, 109 and 110.

The bridge arrangement which the sensor circuit is arranged in may comprise, not least for example a Wheatstone bridge arrangement. Where the bridge circuit arrangement comprises a Wheatstone bridge arrangement, the electrical components 108, 109 and 110 of each arm have each have their own impedance value (that may have both a resistive and reactive component). The electrical components may serve as reference components of known impedance values. In certain examples the electrical components may correspond to resistors. In one particular example, the values of the resistors 108 and 109 may be the same ($R_0$) and the value of the resistor 110 is the same as a nominal resistance ($R_G$) of the sensor 102. A variation of the resistance ($\Delta R_G$) of the sensor 102 may cause a voltage differential to be provided between the output terminals 104 and 105. A measurement of the parameter of the sensor may be determined based on the measurement of the voltage differential between the output terminals 104 and 105. The use of a bridge arrangement, such as a Wheatstone bridge arrangement, enables a high accuracy of resistance measurement values of the sensor and thus high accuracy of sensor measurements.

The apparatus 100 is configured so as to prevent a current from being able to flow from one output terminal through the sensor circuit to the other output terminal. For example, the apparatus may be configured such that, were a voltage to be applied to the output terminals 104 and 105, a current would be unable to flow from output terminal 105 though the arms B'A and AB to output terminal 104 and likewise a current would be unable to flow from output terminal 105 through arms B'C and CB to output terminal 104. Similarly, the apparatus may be configured so as to prevent the flow of a current from output terminal 104 through the arms BA and AB' to output terminal 105 and likewise so as to prevent the flow of a current from output terminal 104 through the arms BC and CB' to output terminal 105. The prevention of a current being able to flow from one output terminal to another output terminal is illustratively shown with the striked through arrows.

The component blocks 102, 108, 109 110 of each arm of FIG. 1 are functional and the functions described may or may not be performed by a single physical entity (such as is described with reference to the combined resistor and diode of the arms of FIGS. 3A, 3B, 4A, 4B and 5).

The apparatus may be provided with one or more electrical components and/or means for preventing the current from being able to flow from one output terminal to another via the arms of the sensor circuit. In some examples, such means may be one or more of any device, mechanism or circuitry that is configured to prevent current from being able to flow from one output terminal to another via the arms of the sensor circuit. In some examples, such means may be an arrangement of electrical components arranged to prevent the current from being able to flow from one output terminal to another via the arms of the sensor circuit, not least for example by the appropriate provision of: diodes, transistors and/or switches.

The prevention of a flow of current, i.e. conventional current, from one of the output terminals to another of the output terminals via arms of the sensor circuits prevents a voltage difference applied to the output terminals causing a flow of current through the sensor circuit. This allows for the output of a first sensor circuit to be coupled in parallel together with other outputs of other sensor circuits without adversely affecting the overall output. In effect, any further sensor circuits connected in parallel would be 'open circuit' or in effect 'electrically isolated' from the first sensor circuit's output voltage. The impedance of any such additional sensor circuits connected in parallel would not affect the first sensor circuit's output. This can avoid a 'voltage drop' of the output voltage of a first sensor circuit which might otherwise have occurred i.e. due to routing resistance and transistor channel resistance if the output voltage were allowed to cause a current to flow through each of the other sensor circuits. The apparatus's output may also be more resilient to variations of impedance of the various sensing circuits which may occur under changing environmental conditions, e.g. temperature or humidity. Also a single output common to all of the parallel connected sensor circuits can be provided enabling only a single output to be required for reading out the entire array even if each sensor of the array might have very different impedance values. This may reduce the number of lead outs that might otherwise have been required if each sensor circuit were to have its own individual and separate lead outs. This may provide a simplified overall architecture which may enable apparatuses of the present disclosure to be combined and scaled to an arbitrary sized sensor array of sensor circuits with minimal loss in accuracy of sensor readout. Examples of the present disclosure enable an array of sensor circuits to be provided where each sensor circuit may have different impedance values and sensors of each sensor circuit could be configured to sense a different property/parameter, not least for example one or more of: temperature, humidity, pressure, stress, strain, and light.

In some examples, the sensor may comprise a graphene based sensor. The graphene based sensor may be configured, not least for example, as a photodetector and/or biosensor.

The graphene based sensor may be realized as a graphene field effect transistor (GFET) structure, where a sensing layer is employed directly above a graphene layer. Charges generated in the sensing layer gate the GFET device and change the current flowing through the device. In this manner, the GFET may be considered, in effect, as equating to a variable resistor which can be read-out using a sensor circuit as described above. Examples of the present disclosure may enable the outputs of a plurality of graphene based sensor circuits to be coupled in parallel. This may allow measurements from the plurality of graphene based sensors to be read out from a single common output pair and thus require only a single pair of lead outs (i.e. as opposed to requiring a pair of lead outs for each individual sensor circuit of the plurality of sensor circuits). Thus a simpler/reduced complexity arrangement may be provided for reading out/ measuring a plurality of sensor circuits.

Figure 2:
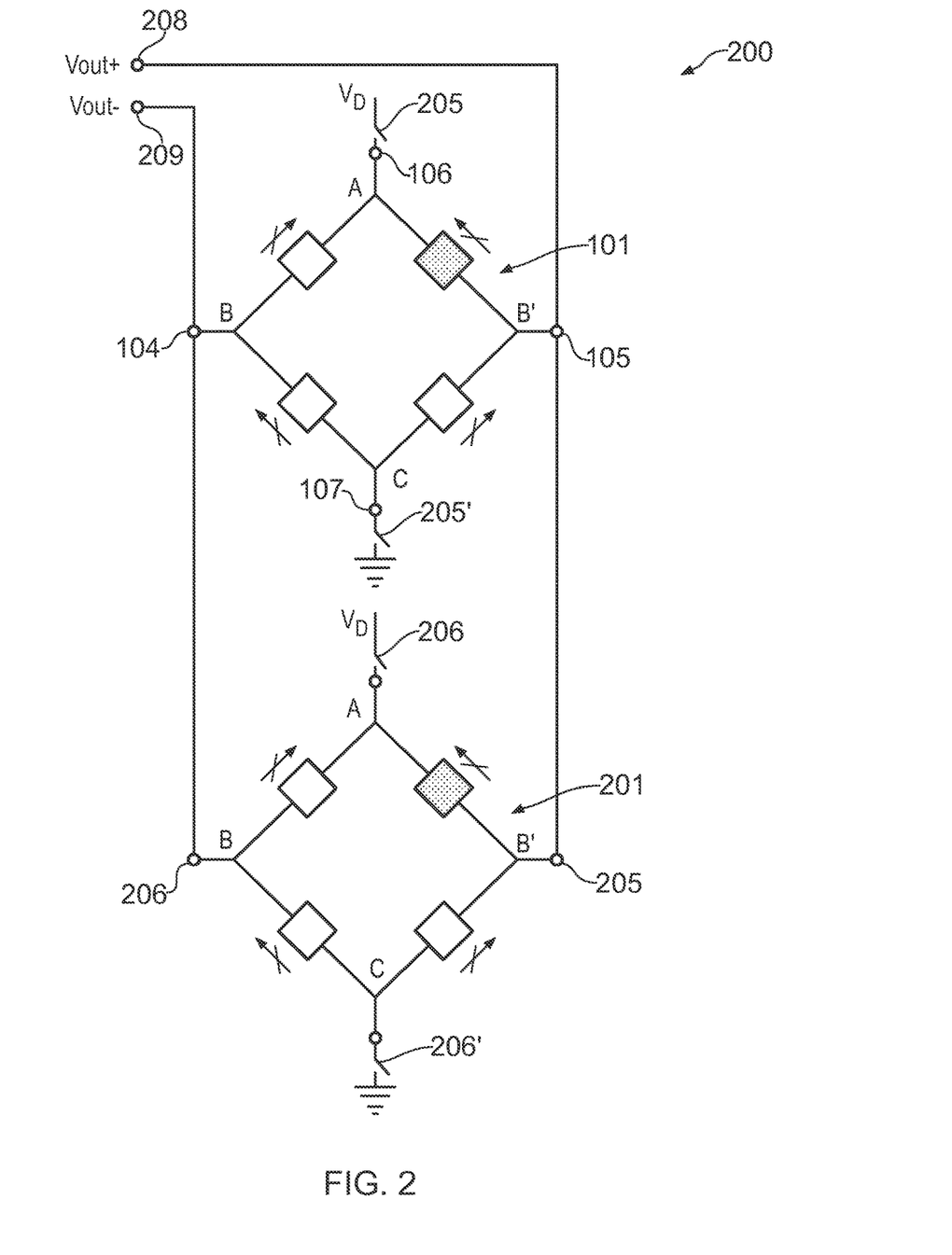
FIG. 2 schematically illustrates a further example apparatus of the present disclosure.

FIG. 2 schematically illustrates a further apparatus 200 comprising the sensor circuit 101 of FIG. 1 in combination with a second sensor circuit 201. The output of the first sensor circuit 101 is connected in parallel with the output of the second sensor circuit 201.

The input terminals 106 and 107 of the first sensor circuit 101 are selectively coupled to an input voltage $V_D$ and a lower potential, e.g. ground, via switches 205 and 205' respectively. Likewise, the second sensor circuit 201 is selectively coupled to the input voltage $V_D$ and the ground via respective switches 206 and 206'.

The coupling of all of the outputs of the sensor circuits together in parallel enables just a single overall output 208, 209 to be provided for all of the sensor circuits thereby facilitating the reading out of the output from individual ones of sensor circuits. It is to be appreciated that further additional circuits may also be provided whose outputs may be connected in parallel so as to form a sensor array.

The ability to selectively couple each sensor circuit to an input voltage may enable individual selection/addressing of a single sensor circuit from a plurality of sensor circuits of an array such that the measured array output at terminals 208 and 209 corresponds to the output just of the single selected/addressed sensor circuit.

The decoupling of a non-selected sensor circuit from an input voltage means that no voltage differential is generated by the non-selected sensor circuit across its output terminals. Thus, the non-selected sensor circuit does not contribute any voltage to the overall array voltage output. The decoupling of a non-selected sensor circuit from the ground precludes the possibility of routing path for current to flow from an output terminal of the non-selected sensor circuit to ground, e.g. from B' to C or from B to C.

Thus, examples of the present disclosure may provide an addressing scheme for reading out measurements from each sensor circuit in the array without cross talk from other sensor circuits in the array and avoid any contamination of the signal outputted from the selected sensor circuit due to the other (non-selected) sensor circuits in the array.

Figure 3A:
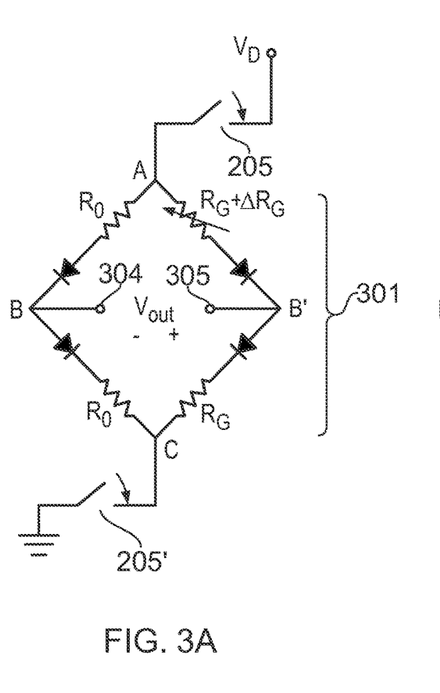
FIGS. 3A and 3B illustrate circuit diagrams of sensor circuits of example apparatuses of the present disclosure.

FIG. 3A illustrates an example of an apparatus 300 of the present disclosure and in particular a circuit diagram showing an arrangement of electrical components of a sensor circuit 301 and also means 205, 205' for selectively coupling the sensor circuit to an input voltage. In the example of FIG. 3A, such means for selecting/addressing the sensor circuit correspond to switches 205 and 205' for selectively coupling/decoupling the sensor circuit 301 to an input voltage $V_D$ and the ground.

The sensor circuit 301 is arranged in a Wheatstone bridge configuration. The sensor circuit 301 functions similarly to a conventional voltage divider Wheatstone bridge when the switches 205 and 205' are closed and a voltage $V_D$ is coupled over the sensor circuit to ground since all of the diodes are in forward bias under such conditions. Based on the voltage differential between the output terminals 304 and 305, a measurement from the sensor may be determined. The use of a Wheatstone bridge configuration may allow for very small changes in the impedance, or resistance, of the sensor to be detected thus can enable a very high accuracy measurement to be measured. For example, where impedance components are used and an impedance value is measured (rather than a pure resistance value) DC voltages could be used for selecting a particular sensor circuit and for biasing the diodes, but then a small AC signal could be applied through the circuitry and the resultant AC signal could be measured (both its magnitude and phase) at the output.

In a first arm AB of the first branch ABC, a resistor having a normal resistance value of $R_0$ is provided in series with a diode which is forward biased with respect to the input voltage (i.e. such that a current may flow from node point A to B, but not from node point B to A). Likewise, in the second arm BC of the first branch ABC, a resistor with a normal resistance value of $R_0$ is provided in series with a diode which again is forward biased. In each of the arms AB' and B'C of the second branch AB'C, a diode is provided, arranged so as to be forward biased. Also in the first arm AB' of the second branch a sensor is provided in series with the diode. The sensor has a nominal value of $R_G$, however, the sensor's resistance is configured to vary $\Delta R_G$, wherein the variation of the resistance depends on the parameter being sensed by the sensor. In the second arm B'C of the second branch, a further resistor having a normal value of $R_G$ is provided in series with the diode.

Accordingly, each arm comprises a diode configured so as to be forward biased so as to enable only the flow of current in one direction only through each branch, i.e. from A to B to C via the first branch and from A to B' to C via the second branch. Whereas the diodes are also configured so as to prevent the flow of current from one output terminal 304 through the arms of the sensor circuit to the other output terminal 305, i.e. preventing the flow of any current from output terminal 304 through arms BA and AB' (or arms BC and CB') to output terminal 305 and likewise preventing the flow of any current from output terminal 305 through arms B'A and AB (or arms B'C and CB) to output terminal 304.

Figure 3B:
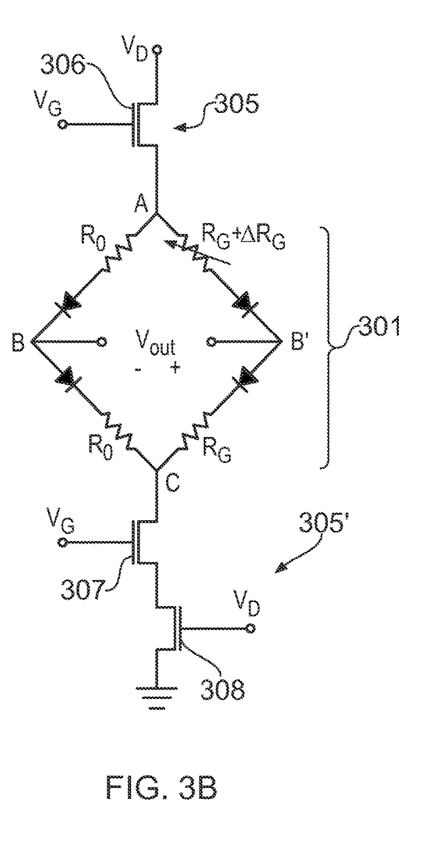

FIG. 3B shows an apparatus 300' with a sensor circuit 301 and alternative means 305, 305' for selectively coupling the sensor circuit to an input voltage. In the example of FIG. 3B, such means for selecting/addressing the sensor circuit comprise an arrangement of transistors 306, 307 and 308 for selectively coupling/decoupling the sensor circuit 301 to an input voltage $V_D$ and the ground.

In some examples, the means for selecting/addressing the sensor circuit, and also the means configured to couple/decouple a sensor circuit to an input voltage and/or ground, may be circuitry duly configured in this regard or an arrangement of electrical components duly arranged in this regard.

The transistor 306 is provided with its: drain connected to $V_D$, gate connected to $V_G$, and source connected to the input of the sensor circuit 301 at node point A. Transistor 307 is provided with its: drain connected the sensor circuit 301 at node point C, gate connected to $V_G$, and source connected to the drain of transistor 308. The gate of transistor 308 is connected to $V_D$ and its source is connected to ground. With such a configuration, the source terminals are connected to the lower potential (e.g. ground) and the drain terminals are connected to the higher potential (e.g. $V_D$).

The apparatuses 300 and 300' each provide an architecture of a sensor circuit 301 which allows for the outputs of a plurality of sensor circuits to be coupled together in parallel to form an array such that only one output is required for reading out measurement from the sensor array. This is achieved via the sensor circuits being arranged in a Wheatstone bridge configuration having a diode in each branch and means configured to selectively couple/decouple each sensor circuit to an input voltage.

Certain examples of the present disclosure provide an architecture for a sensor circuit and sensor array which may provide the following advantages:
high signal to noise ratio for sensor readout,
architecture which is scalable to an arbitrary size sensor array without loss of accuracy of sensor readout, and/or
only a single output required to readout the whole array, even where each sensor circuit may have vastly differing normal impedance values.

Examples of the disclosure may be adapted for large area arrays, such as photo detectors, or may equally well be applicable to low cost flexible sensor array devices such as multi-sensory surfaces for wearable electronics.

Figure 4A:
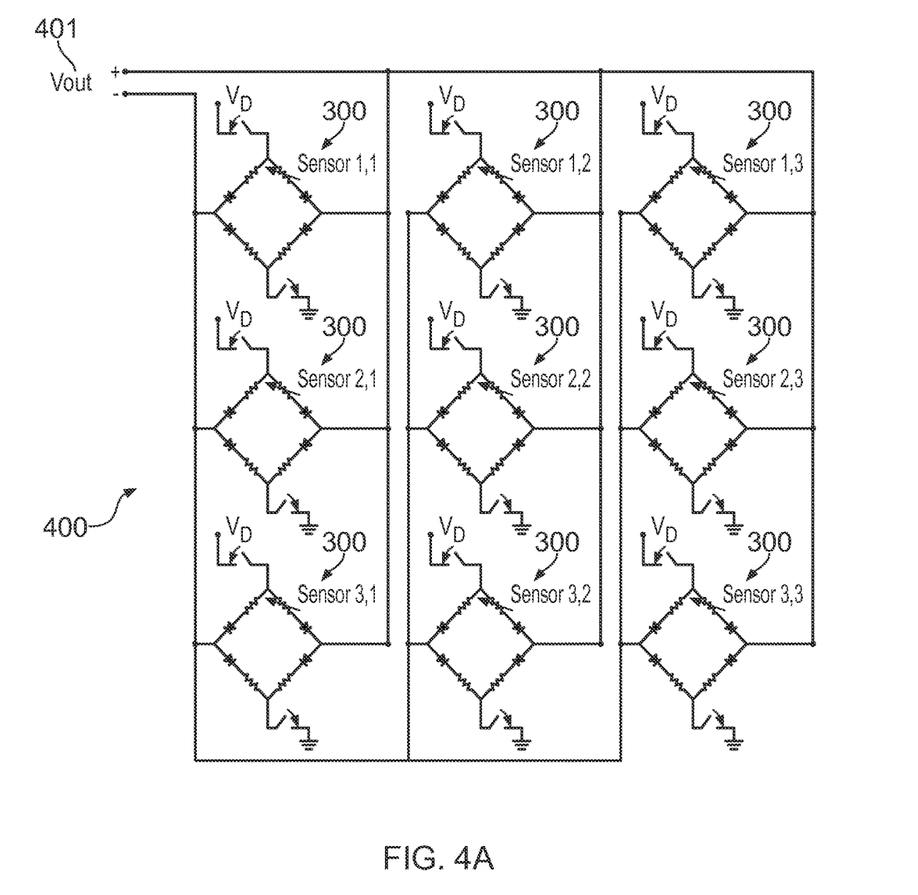
FIGS. 4A and 4B illustrate circuit diagrams of arrays of the sensor circuits of FIGS. 3A and 3B respectively according to examples of apparatuses of the present disclosure.

FIG. 4A illustrates an apparatus 400 comprising an array of apparatuses 300 of FIG. 3A. The apparatuses 300 are arranged as rows and columns which can be selectively addressed and read out individually by selectively coupling a particular one of the apparatuses 300 to $V_D$ and ground, i.e. closing switches 205 and 205' for a particular selected apparatus 300, whilst decoupling all of the remaining apparatuses 300 from an input voltage and ground, i.e. opening the switches 205 and 205' for the non-selected apparatuses 300.

In the array 400 of FIG. 4A, where the output of each apparatus 300 is coupled in parallel, the entire array (in this case exemplified with a 3 by 3 array) is measured from a single output 401 corresponding to the voltage between nodes B and B' of a selected sensor circuit (the non-selected sensor circuits being decoupled from $V_D$ and ground thus not providing/contributing any output).

An active matrix backplane may be provided to selectively couple each selected sensor circuit between the voltage $V_D$ and ground while the other sensor circuits are not coupled to the voltage $V_D$ or ground.

Although an output voltage of a selected sensor circuit (e.g. Sensor 1,1) is coupled, in parallel, to all of the other sensor circuits, there will always be a reverse biased diode in each arm of each other sensor circuit and all the other sensor circuits are decoupled from $V_D$ and ground, which effectively means that all the other sensor circuits apart from the one being presently addressed/selected and measured are 'open circuit' and effectively electrically isolated from the output voltage of the selected sensor circuit. Advantageously, the impedance of the other sensor circuits does not affect the output voltage from the selected sensor circuit being measured at the array output 401.

In some examples, means configured to selectively address one or more of the plurality of sensor circuits for reading an output therefrom may be one or more of any device, mechanism, circuitry or an arrangement of electrical components that is/are configured/arranged to selectively address one or more of the plurality of sensor circuits for reading an output therefrom. In some examples, means configured to couple a selected one or more of the plurality of sensor circuits to an input voltage and/or ground may be one or more of any device, mechanism, circuitry or an arrangement of electrical components that is/are configured/arranged to couple a selected one or more of the plurality of sensor circuits to an input voltage and/or ground. In some examples, means configured to decouple non-selected one or more of the plurality of sensor circuits to an input voltage and/or ground may be one or more of any device, mechanism, circuitry or an arrangement of electrical components that is/are configured/arranged to decouple non-selected one or more of the plurality of sensor circuits to an input voltage and/or ground.

Figure 4B:
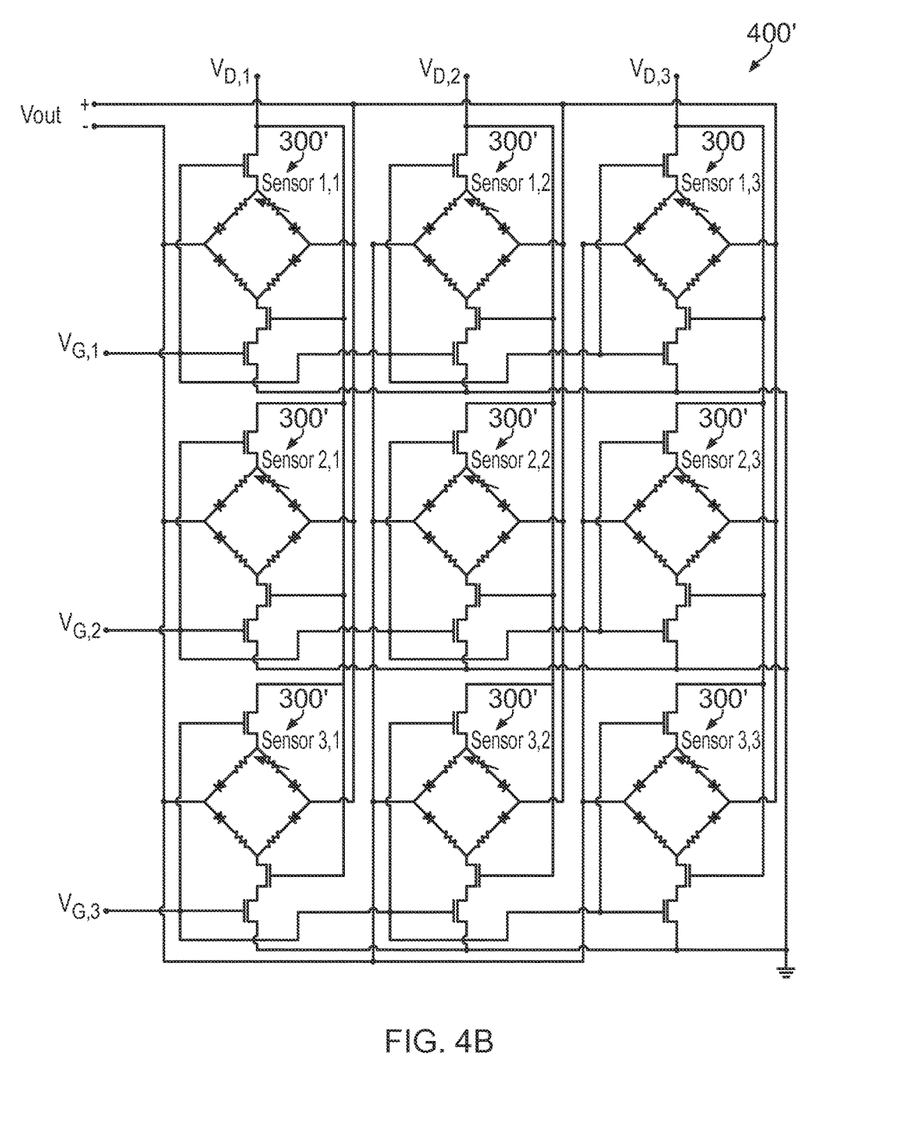

FIG. 4B shows an array 400' of apparatuses 300' of FIG. 3B arranged in a 3 by 3 matrix of rows and columns. Instead of the switches 205 and 205' as per FIG. 3A, the means for selectively coupling and decoupling each sensor circuit 301 to an input voltage $V_D$ and ground is instead provided by transistors. An arrangement of transistors 306, 307 and 308 are provided for each sensor circuit. The transistors may form an active matrix backplane which drives the array of sensor circuits.

In the array 400', $V_D$ is a column voltage which is applied to one column at a time (e.g. one of $V_{D,1}$, $V_{D,2}$ and $V_{D,3}$) and $V_G$ is the row voltage applied to one row at a time (e.g. one of $V_{G,1}$, $V_{G,2}$ and $V_{G,3}$). With the arrangement of FIG. 4B, a sensor circuit 300' of the plurality of sensor circuits can be coupled to both $V_D$ and to ground only when all three transistors have a gate voltage applied, i.e. only when both $V_D$ and $V_G$ are non-zero and large enough to switch the transistors into a conducting 'ON' state.

A single sensor circuit may be selected/addressed (to the exclusion of all others) when its row and column are supplied with $V_G$ and $V_D$ respectively, the remaining sensor circuits would remain unselected/unaddressed. The row and column voltages $V_G$ and $V_D$ may be sequentially addressed one at a time via multiplex circuitry (not shown).

Figure 6:
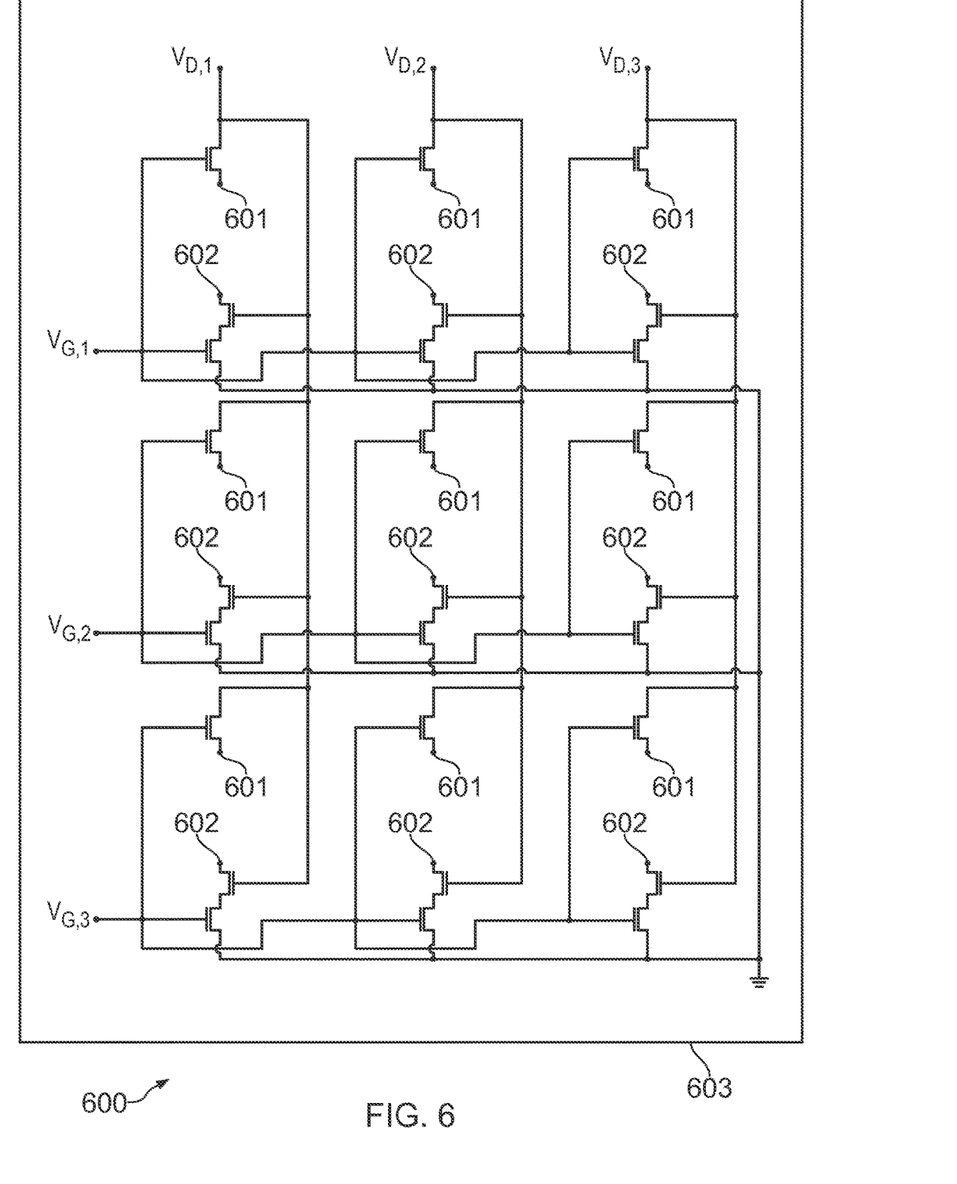
FIG. 6 illustrates selector circuitry for use in selecting individual ones of the sensor circuits of FIG. 5.

In the array 400', (and the transistor architecture 600 of FIG. 6) in each 'cell' of the array, two transistors (306 and 307 with respect to FIG. 3B) are gated by a row voltage $V_{GN}$, but only one transistor (308 with respect to FIG. 3B) is gated by the column voltage $V_{DN}$. In other examples, a further transistor could be provided between the upper node (A) and the input voltage $V_D$, with such a transistor being gated by $V_D$. This would then mean that any other column, which does not have $V_D$ applied would be decoupled, thereby providing an alternative means for selectively decoupling a sensor circuit. In the arrangement of FIGS. 4B and 6, such additional $V_D$ gated transistors are not required as diodes are provided in the branches of the sensor circuit. Accordingly, for example in FIG. 4B, if one were to address sensor 1,1 by applying a voltage at row $V_{G1}$ and a voltage a column $V_{D1}$, while having other $V_{GN}$ rows and $V_{DN}$ columns at zero voltage, then for example the sensor 1,2 would also have the transistors gated by $V_{G1}$ in the ON-state, meaning that the upper node (point A) of sensor 1,2 is actually connected to $V_{D2}$ (which is at zero potential). However, because of the diodes in the branches of sensor circuit 1,2, there would be no current flowing from the output of the sensor circuit 1,2 to $V_{D2}$. Thus, in the configuration of the examples of FIGS. 4B and 6, such additional column voltage $V_{DN}$ gated transistors as described above are not required for decoupling the sensor circuit from the input voltage.

In some examples, the means for selectively addressing one or more of the plurality of sensor circuits may be one or more of any device, mechanism, circuitry or an arrangement of electrical components that is/are configured/arranged to selectively address one or more of the plurality of sensor circuits. In some examples, the means for selectively coupling each of the plurality of sensor circuits to an input voltage and/or ground may be one or more of any device, mechanism, circuitry or an arrangement of electrical components that is/are configured/arranged to selectively couple each of the plurality of sensor circuits to an input voltage and/or ground. In some examples, the means for selectively decoupling each of the plurality of sensor circuits to an input voltage and/or ground may be one or more of any device, mechanism, circuitry or an arrangement of electrical components that is/are configured/arranged to selectively decouple each of the plurality of sensor circuits to an input voltage and/or ground.

Where diodes are incorporated in each sensor circuitry in order to allow the outputs of all the sensor circuits to be coupled in parallel as a single output, this enables that a voltage drop over the diodes in forward bias to be well controlled and small as compared to a voltage drop over resistors in each sensor circuit. Hence the diodes bring minimal error to the output voltage of each sensor circuit even when a small relative change in the sensor impedance is to be measured.

The sensors and electrical impedance components/resistors in the various sensor circuits of an array may have very different nominal impedance values, but nevertheless the same single output can still be used for sensor readout with one single voltage out coupled from an output of the array.

The sensor array can be scaled arbitrarily both in terms of the number of sensor circuits as well as the physical size of the entire array over a substrate. Since the output voltage of the sensor circuits may be measured with minimal current, the resistance of the connector wiring has minimal effect on the accuracy of the readout and thus detection sensitivity.

The architecture of the present disclosure is particularly well suited to large area sensor arrays where a voltage drop along conductor routing can be significant, especially if the routing is printed.

In addition to large area applications, the sensor circuits and sensor array architecture can also lend itself well to flexible or stretchable electronics applications. In the case where the array is configured to be flexible or stretchable, the sensors, transistors and diodes may be discrete components and assembled on a flexible or stretchable carrier substrate. In certain examples, it is possible that the sensor and the sensor circuits themselves are provided on a layer of a substrate which is different from a layer of a substrate on which the means for selecting each sensor (e.g. an active matrix backplane) is provided. In such examples, the two layers can be interconnected by vias.

Figure 5:
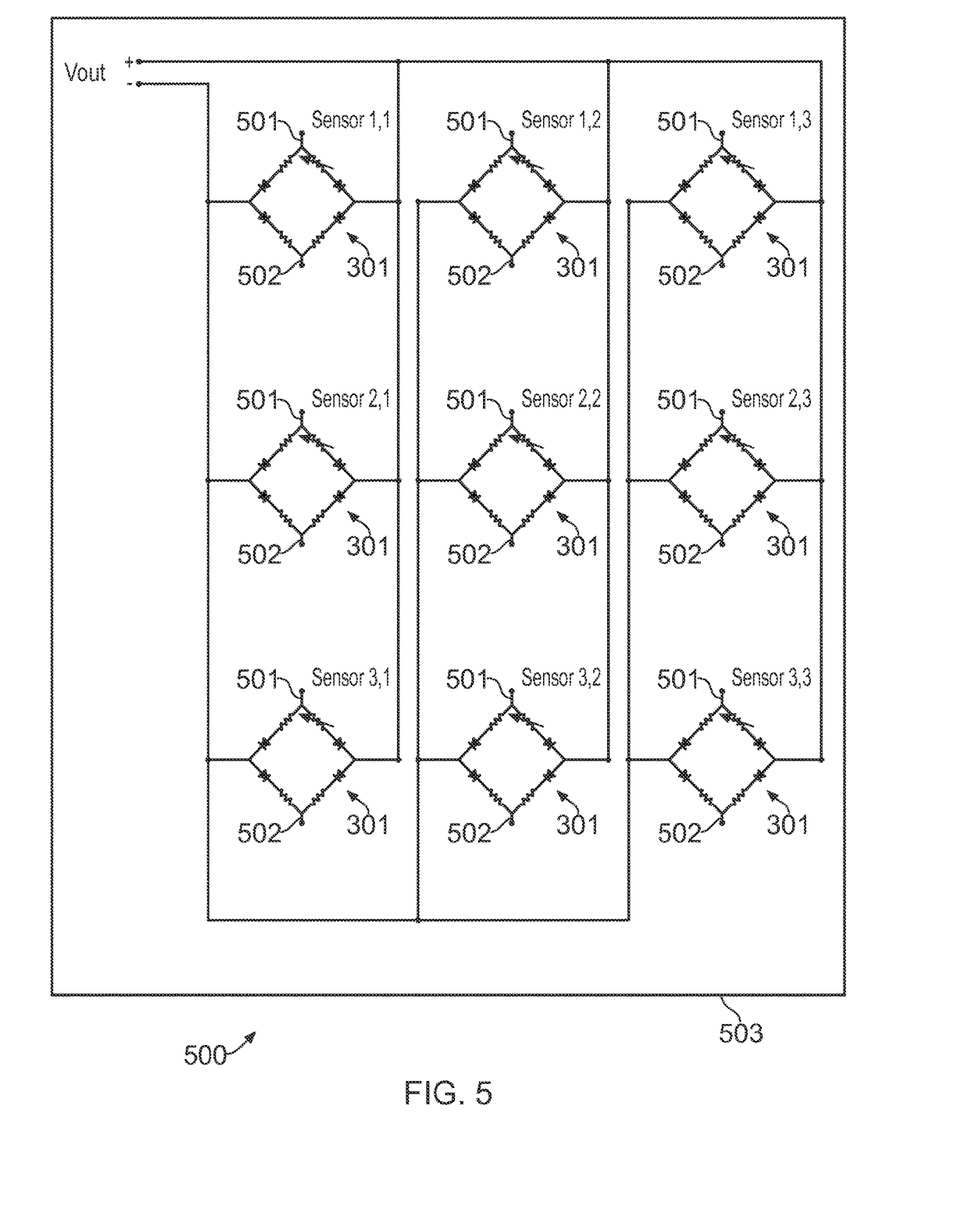
FIG. 5 illustrates an arrangement of sensor circuits according to an example of an apparatus of the present disclosure.

FIG. 5 shows an arrangement of sensor circuits 301 provided in an array and wherein the outputs of each sensor circuit are connected in parallel so as to provide a single output for the array. The apparatus 500 comprises an array of sensor circuits 301 does not include means for selectively coupling each sensor circuit to an input voltage and the ground (instead, such selective coupling/decoupling is separately provided with the apparatus 600 of FIG. 6 in which means for selectively coupling and decoupling each sensor circuit 301 to $V_D$ and the ground are provided). The apparatus 500 provides a Wheatsone bridge sensor array with the apparatus 600 providing a transistor backplane/selector circuitry for selecting individual ones of the sensor circuits for reading out measurements from the selected sensor circuit(s) at the single array output.

The plurality of sensor circuits 301 of the array 500 may be provided on a first substrate 503 (whilst the array of means for selectively addressing each of the variety of sensor circuits and selectively coupling/decoupling each sensor circuits to an input voltage and ground may be provided on a second substrate 603 as shown in FIG. 6).

The transistor architecture of FIG. 6 may be provided on a separate substrate/layer 603 to the substrate/layer 503 which provides the sensor circuit arrangement 500. The transistor backplane 600 may be realised using organic field effect transistors (OFETs). The transistor backplane 600 may be appropriately interconnected to the sensor circuit arrangement 500 by vias at coupling terminal points 501 and 601 as well as terminal points 502 and 602.

The sensor circuits and/or the entire structure comprising both the circuit sensors as well as the means for selectively coupling the sensor circuits to $V_D$ and ground, may be fabricated using printed electronics manufacturing methods such as screen, inkjet, gravure, flexographic printing or by aerosol jet deposition.

The above described apparatuses may be provided as one or more of a module, a device or a sensor array.

Figure 7:
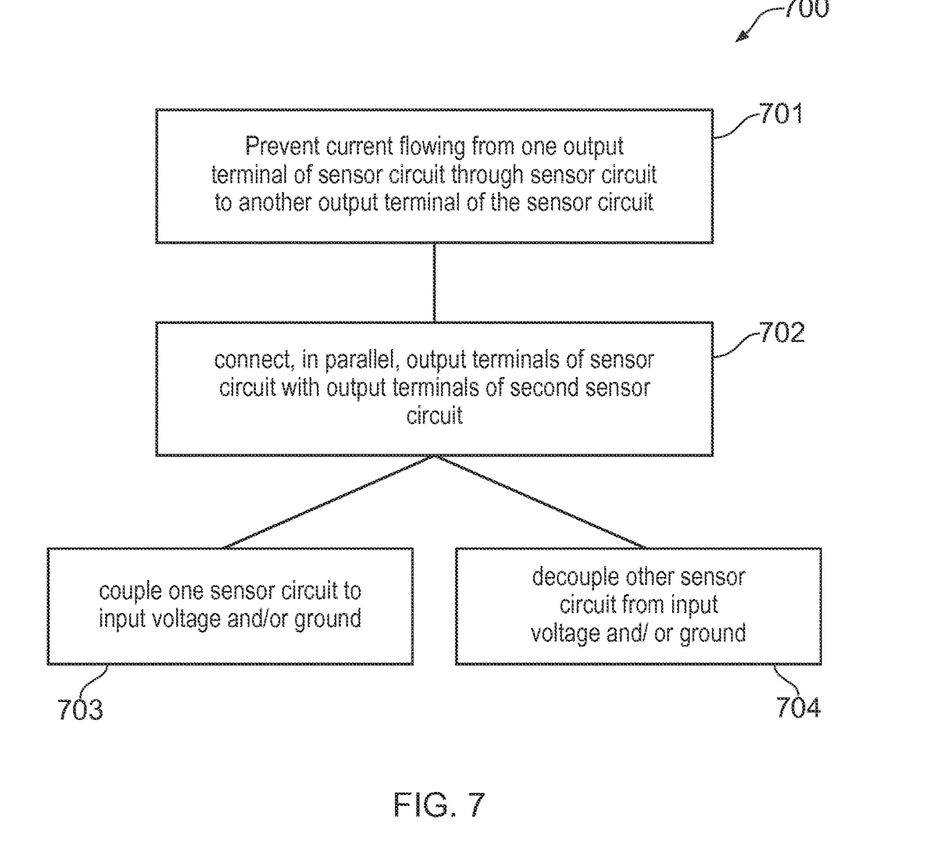
FIG. 7 illustrates a flow chart of an example method of the present disclosure.

FIG. 7 shows a flowchart of a method 700 of the present invention.

In block 701, current is prevented from flowing from an output terminal of a sensor circuit through the sensor circuit itself and out to another output terminal of the sensor circuit. In block 702, the output terminals of the sensor circuit are connected in parallel with output terminals of at least a second sensor circuit. In block 703, one of the sensor circuit and the second sensor circuit is coupled to an input voltage and/or ground. In block 704, the other of the sensor circuit and the second sensor circuit is decoupled from an input voltage and/or ground.

It is to be appreciated that a plurality of sensor circuits may be used in the above method and that one or more of the sensor circuits may be selected for coupling to the input voltage/ground and the remaining, unselected, sensor circuits being decoupled from the input voltage/ground.

The flowchart of FIG. 7 represents one possible scenario among others. The order of the blocks shown is not absolutely required, so in principle, the various blocks can be performed out of order. Not all the blocks are essential.

The illustration of a particular order to the blocks does not necessarily imply that there is a required or preferred order for the blocks and the order and arrangement of the block may be varied. Furthermore, it may be possible for some blocks to be omitted.

In certain examples one or more blocks may be performed in a different order or overlapping in time, in series or in parallel. One or more blocks may be omitted or added or changed in some combination of ways.

In accordance with a further example of the present disclosure, there is provided an apparatus comprising means configured to enable the apparatus to at least perform the above method.

Although examples of the apparatus have been described in terms of comprising various components, it should be understood that the components may be embodied as or otherwise controlled by a corresponding processing element or processor of the apparatus. In this regard, each of the components described below may be one or more of any device, means, circuitry or an arrangement of electrical components that is/are configured to perform the corresponding functions of the respective components as described above. For example, the diodes of the sensor circuits to prevent the 'back flow' of current up the arms of the branches could be replaced by switches or transistors in each arm of between each output terminal and common output line, e.g. at points B and B'. (However, the use of transistors may cause the sensor measurement or detected accuracy to drop due the voltage output being small and due to possible variations in the channel resistance of the transistor).

Features described in the preceding description may be used in combinations other than the combinations explicitly described. Examples of the present disclosure and the accompanying claims may be suitably combined in any manner apparent to one of ordinary skill in the art.

The term 'comprise' is used in this document with an inclusive not an exclusive meaning. That is any reference to X comprising Y indicates that X may comprise only one Y or may comprise more than one Y. If it is intended to use 'comprise' with an exclusive meaning then it will be made clear in the context by referring to "comprising only one . . . " or by using "consisting".

In this description, the wording 'connect', 'couple' and their derivatives mean operationally connected/coupled. It should be appreciated that any number or combination of intervening components can exist (including no intervening components).

In this description, reference has been made to various examples. The description of features or functions in relation to an example indicates that those features or functions are present in that example. The use of the term 'example' or 'for example' or 'may' in the text denotes, whether explicitly stated or not, that such features or functions are present in at least the described example, whether described as an example or not, and that they can be, but are not necessarily, present in some or all other examples. Thus 'example', 'for example' or 'may' refers to a particular instance in a class of examples. A property of the instance can be a property of only that instance or a property of the class or a property of a sub-class of the class that includes some but not all of the instances in the class.

In this description, references to "a/an/the" [feature, element, component, means . . . ] are to be interpreted as "at least one" [feature, element, component, means . . . ] unless explicitly stated otherwise.

The above description describes some examples of the present disclosure however those of ordinary skill in the art will be aware of possible alternative structures and method features which offer equivalent functionality to the specific examples of such structures and features described herein above and which for the sake of brevity and clarity have been omitted from the above description. Nonetheless, the above description should be read as implicitly including reference to such alternative structures and method features which provide equivalent functionality unless such alternative structures or method features are explicitly excluded in the above description of the examples of the present disclosure.

Although features have been described with reference to certain examples, those features may also be present in other examples whether described or not. It should be appreciated that modifications to the examples given can be made without departing from the scope of the invention as set out in the claims.

Whilst endeavouring in the foregoing specification to draw attention to those features of examples of the present disclosure believed to be of particular importance it should be understood that the applicant claims protection in respect of any patentable feature or combination of features hereinbefore referred to and/or shown in the drawings whether or not particular emphasis has been placed thereon.

The invention claimed is:

1. An apparatus comprising:
    a sensor circuit comprising:
        a first output terminal;
        a second output terminal; and
        a sensor provided in a bridge circuit arrangement;
    at least a second sensor circuit, the at least second sensor circuit comprising a further first output terminal and a further second output terminal, wherein the output terminals of the sensor circuit are connected in parallel with the further output terminals of the at least second sensor circuit; and
    a processor configured to cause the apparatus to at least perform the following:
        determine a sensor measurement based on a voltage difference between the first and second output terminals;
        prevent a current from being able to flow from the first output terminal through the sensor circuit to the second output terminal; and
        selectively couple and decouple at least one of the sensor circuit and the at least second sensor circuit to ground.

2. The apparatus of claim 1, wherein the bridge circuit arrangement is a Wheatstone bridge arrangement.

3. The apparatus of claim 1, wherein the processor is further configured to cause the apparatus to at least perform one or more of the following:
    selectively couple and decouple one or more of the sensor circuit and the at least second sensor circuit to an input voltage.

4. The apparatus of claim 1, wherein the bridge circuit arrangement comprises a plurality of circuit branches, wherein a circuit branch of the plurality of circuit branches comprises a plurality of arms, and wherein an arm of the plurality of arms comprises at least one impedance component.

5. The apparatus of claim 1, wherein the bridge circuit arrangement comprises a plurality of circuit branches, wherein a circuit branch of the plurality of circuit branches comprises a plurality of arms, and wherein an arm of the plurality of arms comprises at least one diode.

6. The apparatus of claim 1, wherein the bridge circuit arrangement comprises a plurality of circuit branches, wherein a circuit branch of the plurality of circuit branches comprises a plurality of arms, and wherein an arm of the plurality of arms comprises at least one transistor.

7. The apparatus of claim 1, wherein the bridge circuit arrangement comprises a plurality of circuit branches, wherein a circuit branch of the plurality of circuit branches comprises a plurality of arms, and wherein an arm of the plurality of arms comprises at least one switch.

8. The apparatus of claim 1, further comprising, a plurality of sensor circuits.

9. The apparatus of claim 8, further comprising means configured to selectively address one or more of the plurality of sensor circuits for reading an output therefrom.

10. The apparatus of claim 8, further comprising means configured to couple a selected one or more of the plurality of sensor circuits to an input voltage and/or ground.

11. The apparatus of claim 8, further comprising means configured to decouple non-selected sensor circuits from an input voltage and/or ground.

12. The apparatus of claim 8, wherein the plurality of sensor circuits are provided on a first substrate and wherein the apparatus comprises a second substrate comprising one or more of:
    means for selectively addressing one or more of the plurality of sensor circuits;
    means for selectively coupling one or more of the plurality of sensor circuits to an input voltage and/or ground; and
    means for selectively decoupling one or more of the plurality of sensor circuits to an input voltage and/or ground.

13. A module, a device or an array comprising one or more of the apparatuses of claim 1.

14. A method comprising:
    preventing a current from flowing from an output terminal of a sensor circuit through the sensor circuit to another output terminal of the sensor circuit, wherein the sensor circuit comprises: a sensor provided in a bridge circuit arrangement; wherein the sensor circuit is configured such that a sensor measurement can be determined based on a voltage difference between the output terminals of the sensor circuit;
    connecting, in parallel, the output terminals of the sensor circuit with output terminals of at least a second sensor circuit; and at least one of:
  coupling the sensor circuit to ground; and
  decoupling the second sensor terminal from ground.
15. The method according to claim 14, further comprising at least one:
  coupling the sensor circuit to an input voltage; and
  decoupling the second sensor terminal from an input voltage.

* * * * *

UNITED STATES PATENT AND TRADEMARK OFFICE
CERTIFICATE OF CORRECTION

PATENT NO. : 10,222,231 B2
APPLICATION NO. : 15/523444
DATED : March 5, 2019
INVENTOR(S) : Mark Allen Page 1 of 1

It is certified that error appears in the above-identified patent and that said Letters Patent is hereby corrected as shown below:

In the Claims

In Claim 15:
Column 13, Line 5, "at least one" should be deleted and -- at least one of -- should be inserted Signed and Sealed this
Sixteenth Day of July, 2019

Andrei Iancu
*Director of the United States Patent and Trademark Office*